United States Patent
Levesque

(10) Patent No.: US 7,471,155 B1
(45) Date of Patent: Dec. 30, 2008

(54) CANCELLING SWITCHING POWER SUPPLY RIPPLE FROM A RADIO FREQUENCY SIGNAL

(75) Inventor: Chris Levesque, Fountain Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 31 days.

(21) Appl. No.: 11/753,888

(22) Filed: May 25, 2007

(51) Int. Cl.
*H03F 3/04* (2006.01)
(52) U.S. Cl. ................................ 330/297; 330/296
(58) Field of Classification Search ................ 330/297, 330/285, 296, 298, 207 P
See application file for complete search history.

(56) References Cited

U.S. PATENT DOCUMENTS

| | | | | |
|---|---|---|---|---|
| 4,357,579 A | * | 11/1982 | Kato et al. | 330/297 |
| 4,543,539 A | * | 9/1985 | Seki et al. | 330/297 |
| 6,483,727 B2 | * | 11/2002 | Oki et al. | 363/39 |
| 6,489,755 B1 | * | 12/2002 | Boudreaux et al. | 323/282 |
| 7,403,400 B2 | * | 7/2008 | Stanley | 363/16 |

\* cited by examiner

*Primary Examiner*—Henry K Choe
(74) *Attorney, Agent, or Firm*—Withrow & Terranova, P.L.L.C.

(57) ABSTRACT

The present invention is ripple cancellation circuitry used with a switching power supply, which provides direct current (DC) power via a DC power amplifier (PA) signal to an RF PA final stage. The DC PA signal includes a DC component and a power supply ripple component, which is generated as a result of the switching characteristics of the switching power supply and creates an output ripple in an RF output signal from the PA final stage. The ripple cancellation circuitry substantially cancels the output ripple by adding a ripple cancellation signal having a ripple component that is phase-shifted approximately 180 degrees from the output ripple to the RF output signal. The ripple cancellation circuitry uses a switching signal that is provided by the switching power supply to generate the ripple cancellation signal.

22 Claims, 12 Drawing Sheets

CANCELLING SWITCHING POWER SUPPLY RIPPLE FROM A RADIO FREQUENCY SIGNAL

FIELD OF THE INVENTION

The present invention relates to radio frequency (RF) amplifier circuits that are powered from switching power supplies.

BACKGROUND OF THE INVENTION

With the growth of the wireless communications industry, wireless communications protocols become more sophisticated and demanding in their requirements for complex modulation schemes and narrow channel bandwidths. Transmitter output spectrum requirements become more restrictive and less tolerant of spurious transmissions. Third-generation (3G) mobile phone standards may be particularly restrictive.

Switching power supplies are sometimes used to provide power to RF power amplifiers (PAs), since the efficiencies of switching power supplies can be fairly high. Additionally, the magnitudes of switching power supply outputs can be varied to maintain high efficiencies at different output power levels, or to amplitude modulate PAs. However, one drawback to using a switching power supply to power a PA is that a switching power supply uses switching signals at a switching frequency and may generate a ripple signal at the switching frequency and harmonics of the switching frequency. The ripple signal may be coupled into the PA and appear at the PA's RF output, and may violate output spectrum requirements. Thus, there is a need to reduce the impact of switching power supply ripple on the output spectrum of a PA.

SUMMARY OF THE INVENTION

The present invention is ripple cancellation circuitry used with a switching power supply, which provides direct current (DC) power via a DC power amplifier (PA) signal to an RF PA final stage. The DC PA signal includes a DC component and a power supply ripple component, which is generated as a result of the switching characteristics of the switching power supply and creates an output ripple in an RF output signal from the PA final stage. The ripple cancellation circuitry substantially cancels the output ripple by adding a ripple cancellation signal having a ripple component that is phase-shifted approximately 180 degrees from the output ripple to the RF output signal. The ripple cancellation circuitry uses a switching signal that is provided by the switching power supply to generate the ripple cancellation signal. The switching signal is based on a switching frequency of the switching power supply that generates the power supply ripple component.

In one embodiment of the present invention, the ripple cancellation circuitry may include phase-shifting circuitry to phase-shift the ripple cancellation signal to substantially cancel the output ripple. Due to delays in the ripple cancellation circuitry, the ripple cancellation signal may be one or more cycles delayed from the switching signal; therefore, the required phase-shift may be based on the switching frequency. Switching frequency information may be provided to the ripple cancellation circuitry in a separate switching frequency signal. The ripple cancellation circuitry may include amplitude adjustment circuitry to scale the amplitude of the switching signal to substantially cancel the output ripple. The switching power supply may use a DC magnitude control signal to vary the magnitude of the DC component of the DC PA signal. For example, the DC magnitude signal may be based on an amplitude modulation (AM) signal to modulate the DC component, which subsequently amplitude modulates the RF PA output signal. Changes in the magnitude of the DC component may cause changes in the magnitude of the output ripple; therefore, the amplitude adjustment circuitry may use the DC magnitude control signal to adjust the amplitude of the ripple cancellation signal. The ripple cancellation circuitry may include filtering circuitry to remove signals, such as DC signals, that are unrelated to the power supply ripple component.

In one embodiment of the present invention, the DC PA signal may provide the switching signal to the ripple cancellation circuitry. In an alternate embodiment of the present invention, a pulse width modulation (PWM) signal from the switching power supply may provide the switching signal to the ripple cancellation circuitry. The switching power supply has an energy transfer element, such as an inductive element, coupled between a power supply input and a power supply output. Switching circuitry controls transfer of energy from the power supply input to an energy storage element, such as a capacitive element, which is coupled to the power supply output. The PWM signal controls the switching circuitry and the energy transfer by varying the pulse width of the PWM signal, which controls the duty-cycle of the switching circuitry. The power supply ripple component may be mathematically related to the PWM signal. For example, if the energy transfer element is an inductive element, which feeds a capacitive element coupled to the power supply output, then ripple voltage on the capacitive element may be proportional to the double integral of the PWM signal. Therefore, the ripple cancellation circuitry may include at least one integrator.

The PA final stage may include a transistor element to receive the DC PA signal and provide the RF output signal. The ripple cancellation circuitry may be coupled to an input of the transistor element. The transistor element may include biasing circuitry coupled to the input. The biasing circuitry provides a bias to establish an operating point for the transistor element. The ripple cancellation circuitry may be coupled to the biasing circuitry. The transistor element may include a bipolar element, a metal oxide semiconductor (MOS) element, or both. The transistor element may include gallium arsenide, silicon, or both.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

Figure 1:
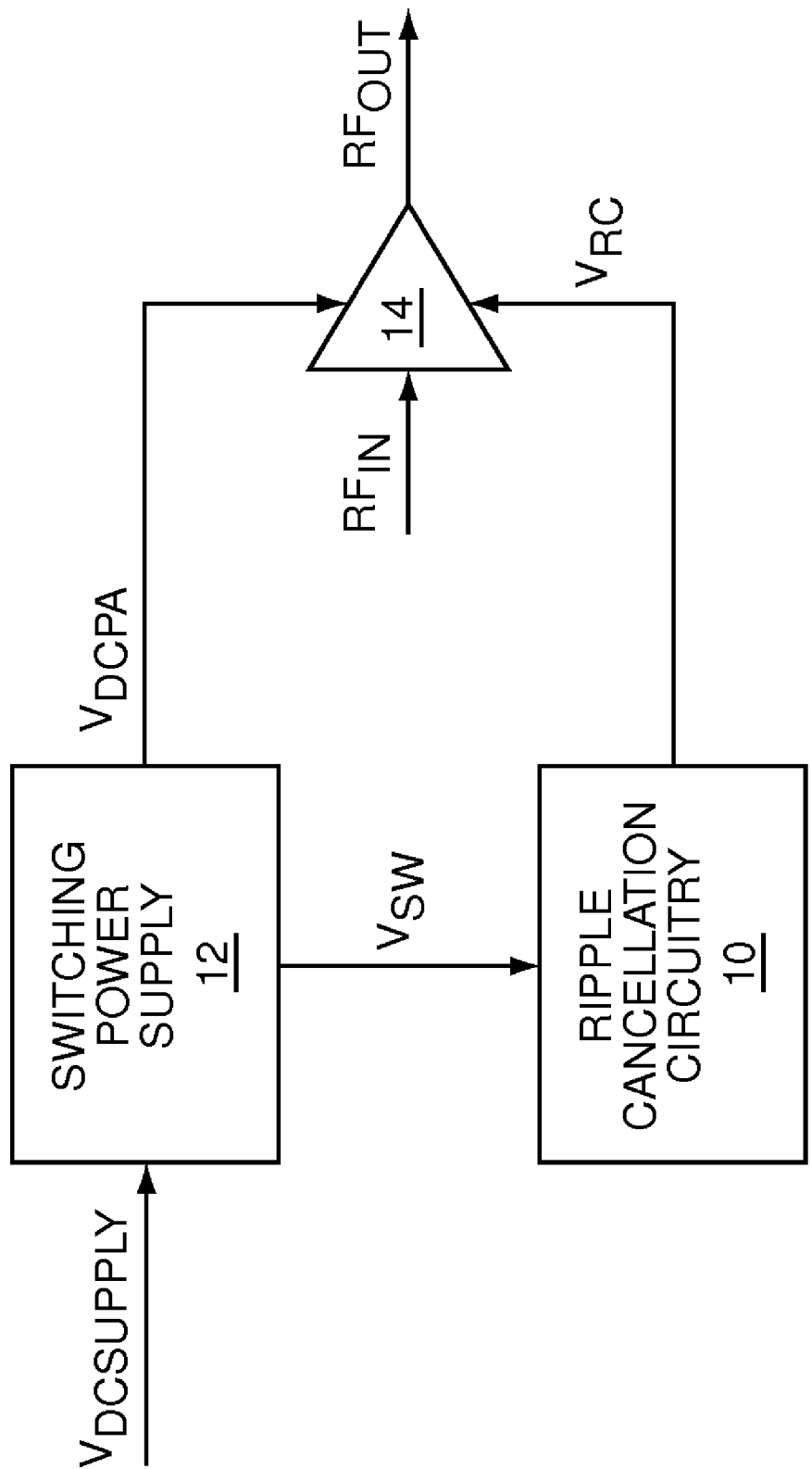
FIG. 1 shows ripple cancellation circuitry, which is used with a switching power supply and a PA final stage, according to one embodiment of the present invention.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is ripple cancellation circuitry used with a switching power supply, which provides direct current (DC) power via a DC power amplifier (PA) signal to an RF PA final stage. The DC PA signal includes a DC component and a power supply ripple component, which is generated as a result of the switching characteristics of the switching power supply and creates an output ripple in an RF output signal from the PA final stage. The ripple cancellation circuitry substantially cancels the output ripple by adding a ripple cancellation signal having a ripple component that is phase-shifted approximately 180 degrees from the output ripple to the RF output signal. The ripple cancellation circuitry uses a switching signal that is provided by the switching power supply to generate the ripple cancellation signal. The switching signal is based on a switching frequency of the switching power supply that generates the power supply ripple component.

In one embodiment of the present invention, the ripple cancellation circuitry may include phase-shifting circuitry to phase-shift the ripple cancellation signal to substantially cancel the output ripple. Due to delays in the ripple cancellation circuitry, the ripple cancellation signal may be one or more cycles delayed from the switching signal; therefore, the required phase-shift may be based on the switching frequency. Switching frequency information may be provided to the ripple cancellation circuitry in a separate switching frequency signal. The ripple cancellation circuitry may include amplitude adjustment circuitry to scale the amplitude of the switching signal to substantially cancel the output ripple. The switching power supply may use a DC magnitude control signal to vary the magnitude of the DC component of the DC PA signal. For example, the DC magnitude signal may be based on an amplitude modulation (AM) signal to modulate the DC component, which subsequently amplitude modulates the RF output signal. Changes in the magnitude of the DC component may cause changes in the magnitude of the output ripple; therefore, the amplitude adjustment circuitry may use the DC magnitude control signal to adjust the amplitude of the ripple cancellation signal. The ripple cancellation circuitry may include filtering circuitry to remove signals, such as DC signals, that are unrelated to the power supply ripple component.

In one embodiment of the present invention, the DC PA signal may provide the switching signal to the ripple cancellation circuitry. In an alternate embodiment of the present invention, a pulse width modulation (PWM) signal from the switching power supply may provide the switching signal to the ripple cancellation circuitry. The switching power supply has an energy transfer element, such as an inductive element, coupled between a power supply input and a power supply output. Switching circuitry controls transfer of energy from the power supply input to an energy storage element, such as a capacitive element, which is coupled to the power supply output. The PWM signal controls the switching circuitry and the energy transfer by varying the pulse width of the PWM signal, which controls the duty-cycle of the switching circuitry. The power supply ripple component may be mathematically related to the PWM signal. For example, if the energy transfer element is an inductive element, which feeds a capacitive element coupled to the power supply output, then ripple voltage on the capacitive element may be proportional, or approximately equal, to the double integral of the PWM signal. Therefore, the ripple cancellation circuitry may include at least one integrator.

The PA final stage may include a transistor element to receive the DC PA signal and provide the RF output signal. The ripple cancellation circuitry may be coupled to an input of the transistor element. The transistor element may include biasing circuitry coupled to the input. The biasing circuitry provides a bias to establish an operating point for the transistor element. The ripple cancellation circuitry may be coupled to the biasing circuitry. The transistor element may include a bipolar element, a metal oxide semiconductor (MOS) element, or both. The transistor element may include gallium arsenide, silicon, or both.

FIG. 1 shows ripple cancellation circuitry 10, which is used with a switching power supply 12 and a PA final stage 14, according to one embodiment of the present invention. A DC supply signal $V_{DCSUPPLY}$ provides DC power to the switching power supply 12 from a power source (not shown), such as a battery. The switching power supply 12 provides DC power to the PA final stage 14 by feeding a DC PA signal $V_{DCPA}$ to the PA final stage 14. An RF input signal $RF_{IN}$ feeds the PA final stage 14, which amplifies the RF input signal $RF_{IN}$ to provide an RF output signal $RF_{OUT}$. The switching power supply 12 feeds a switching signal $V_{SW}$ to the ripple cancellation circuitry 10, which provides a ripple cancellation signal $V_{RC}$ to the PA final stage 14. The DC PA signal $V_{DCPA}$ includes a DC component, which is used by the PA final stage 14 to provide the power for amplification, and a power supply ripple component, which is an undesirable side effect of the switching power supply 12. The power supply ripple component may cause output ripple in the RF output signal $RF_{OUT}$. The PA final stage 14 combines the ripple cancellation signal $V_{RC}$ with the effects of the power supply ripple component to substantially cancel the output ripple.

Figure 2:
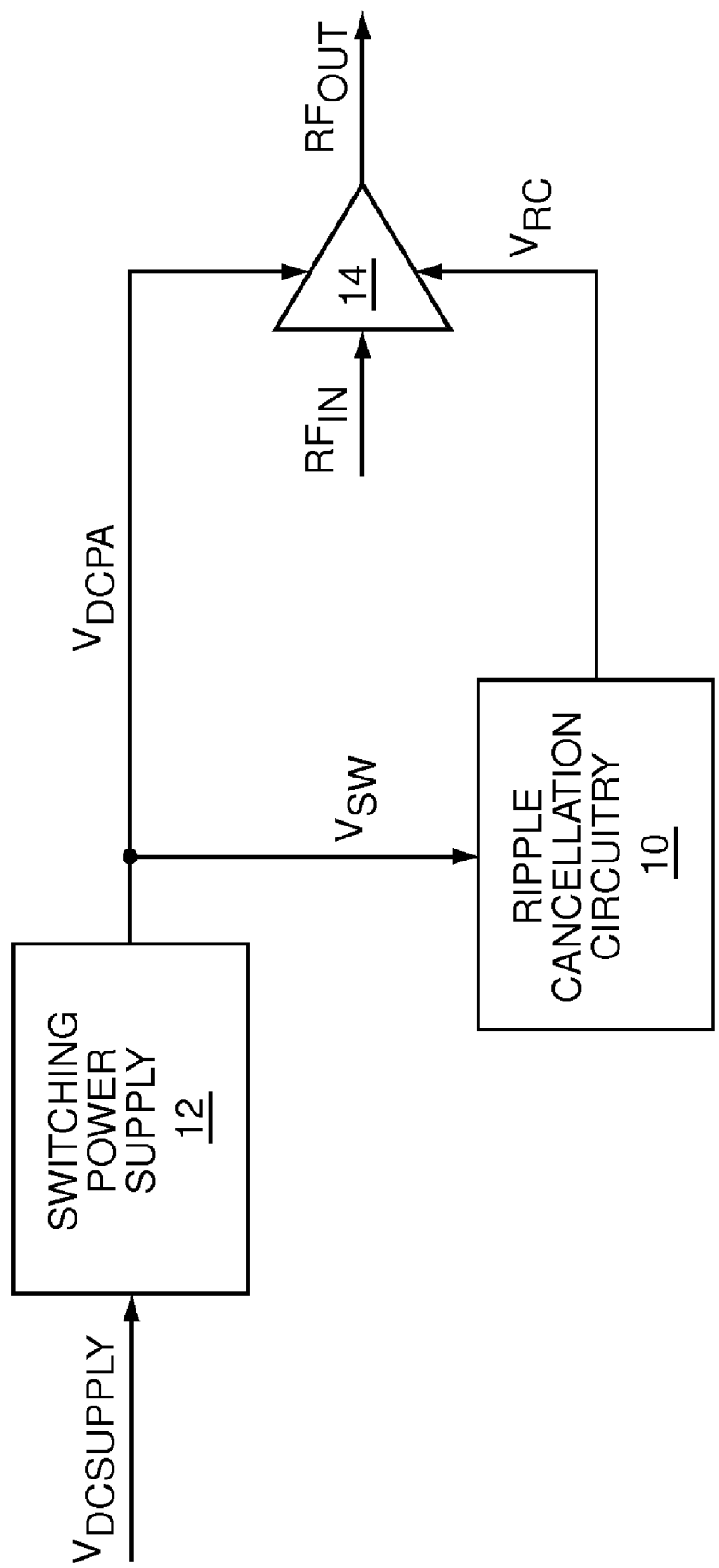
FIG. 2 shows the switching signal being supplied by the DC PA signal, according to one embodiment of the present invention.

FIG. 2 shows the switching signal $V_{SW}$ being supplied by the DC PA signal $V_{DCPA}$, according to an alternate embodiment of the present invention. The DC PA signal $V_{DCPA}$ provides the power supply ripple component; therefore, the required ripple cancellation signal $V_{RC}$ can be extracted from the DC PA signal $V_{DCPA}$.

Figure 3:
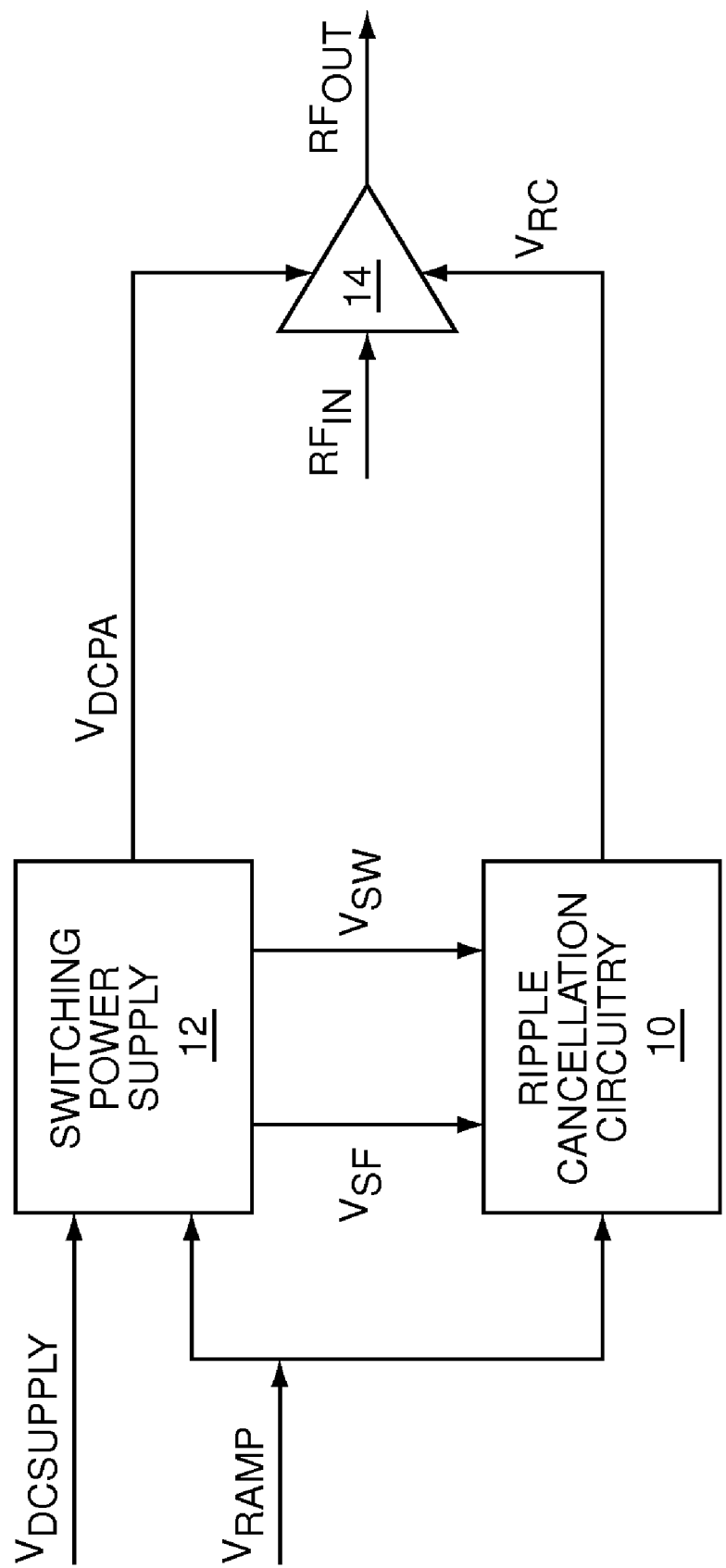
FIG. 3 shows a switching frequency signal feeding the ripple cancellation circuitry from the switching power supply.

FIG. 3 shows a switching frequency signal $V_{SF}$ feeding the ripple cancellation circuitry 10 from the switching power supply 12. In one embodiment of the present invention, due to delays in the ripple cancellation circuitry, the ripple cancellation signal $V_{RC}$ may be delayed by one or more cycles from the switching signal $V_{SW}$; therefore, the required phase-shift may be based on the switching frequency. Switching frequency information may be provided by the switching frequency signal $V_{SF}$. A DC magnitude control signal $V_{RAMP}$ feeds the switching power supply 12 and the ripple cancellation circuitry 10.

Figure 4:
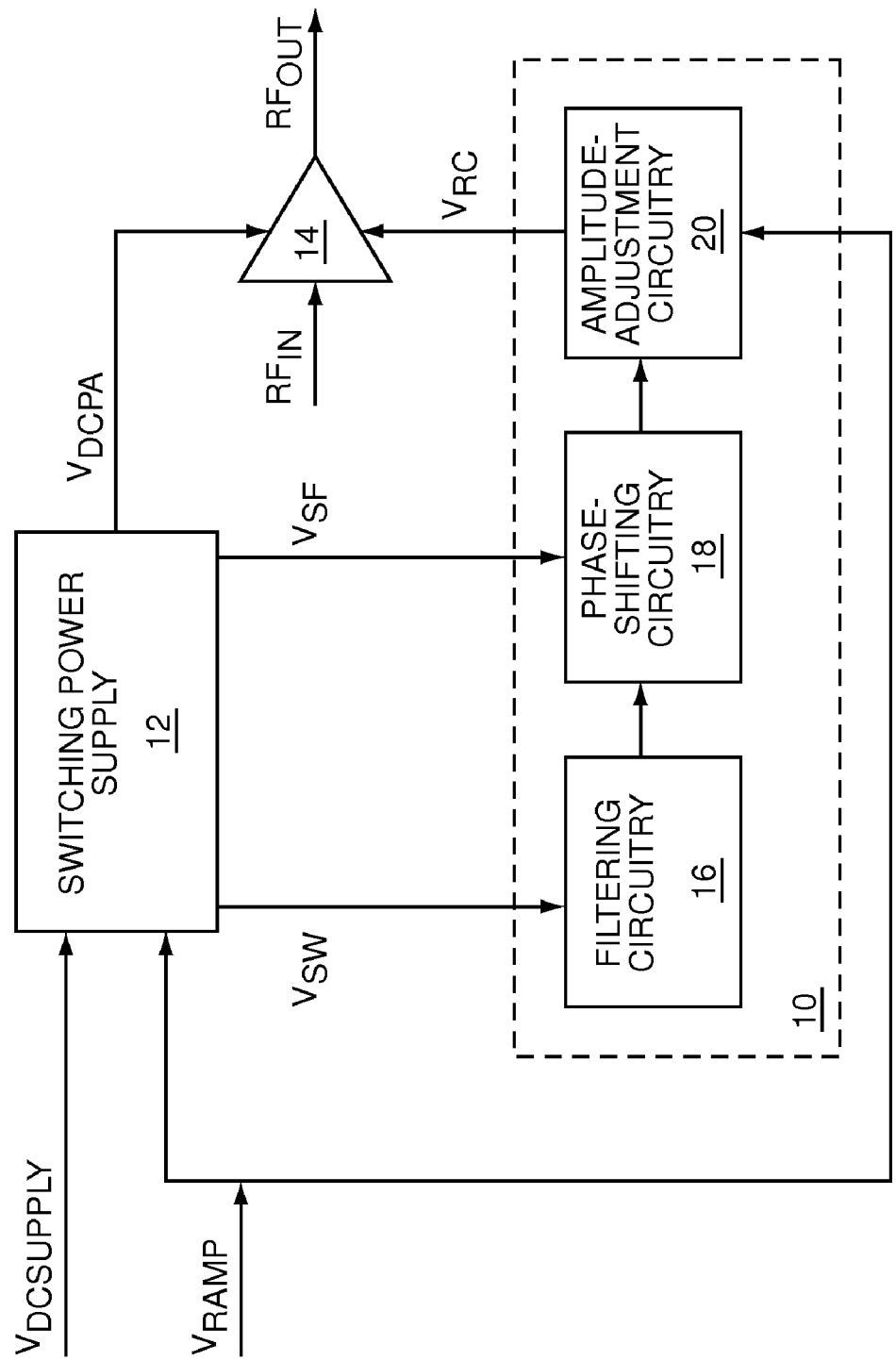
FIG. 4 shows details of the ripple cancellation circuitry illustrated in FIG. 3.

FIG. 4 shows details of the ripple cancellation circuitry 10 illustrated in FIG. 3. The switching signal $V_{SW}$ feeds filtering circuitry 16, which removes signals, such as a DC signal, that are unrelated to ripple cancellation. The filtering circuitry 16 provides a filtered switching signal to phase-shifting circuitry 18, which applies any phase-shifting needed for output ripple cancellation. The switching frequency signal $V_{SF}$ provides any needed switching frequency information. The phase-shifting circuitry 18 provides a phase-shifted switching signal to amplitude-adjustment circuitry 20, which scales the amplitude of the phase-shifted switching signal, as needed. The DC magnitude control signal $V_{RAMP}$ feeds the switching power supply 12 and the amplitude-adjustment circuitry 20 to control the magnitude of the DC component of the DC PA signal $V_{DCPA}$, and to adjust the amplitude of the phase-shifted switching signal as needed in response to output power changes. The amplitude-adjustment circuitry 20 provides the ripple cancellation signal $V_{RC}$ to the PA final stage 14 based on a filtered, phase-shifted, and amplitude-adjusted switching signal.

Figure 5:
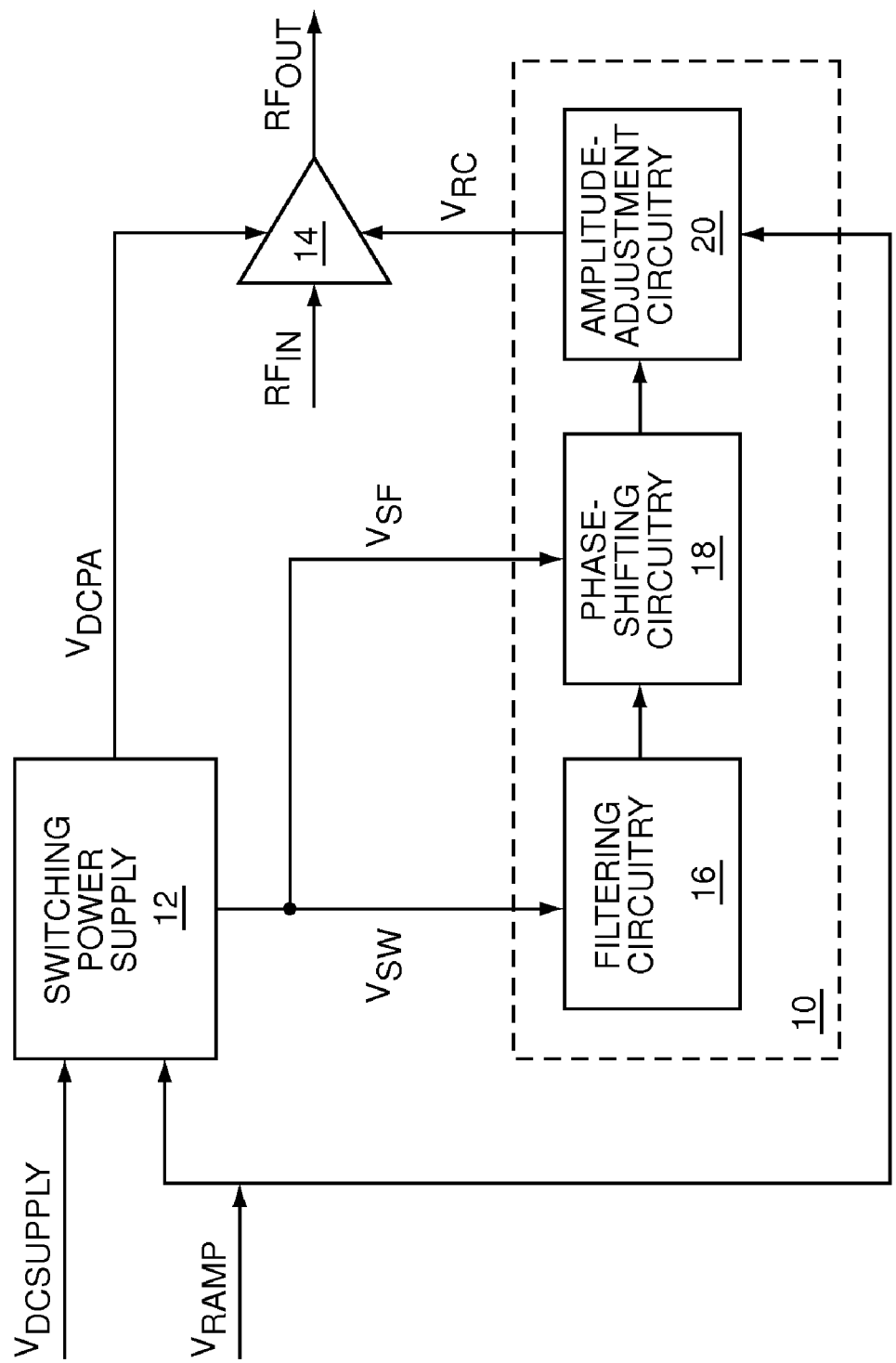
FIG. 5 shows the switching frequency signal being supplied by the switching signal, according to one embodiment of the present invention.
Figure 6:
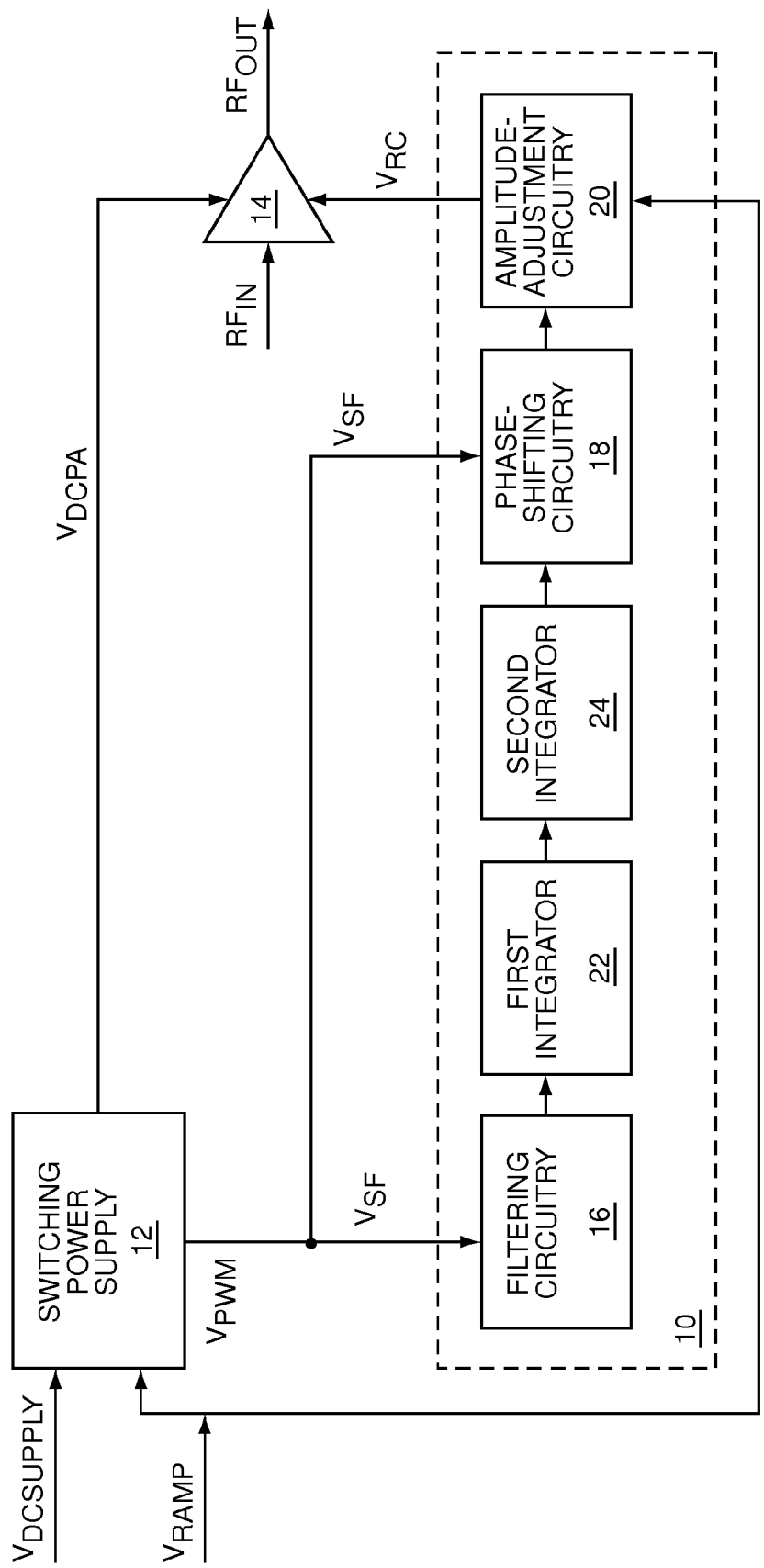
FIG. 6 shows the switching signal and the switching frequency signal being supplied by a pulse width modulation signal, and details of the ripple cancellation circuitry, according to one embodiment of the present invention.

FIG. 5 shows the switching frequency signal $V_{SF}$ being supplied by the switching signal $V_{SW}$, according to an alternate embodiment of the present invention. Since the switching signal $V_{SW}$ is based on the switching frequency of the switching power supply 12, the switching signal $V_{SW}$ can provide the switching frequency information needed by the switching frequency signal $V_{SF}$. FIG. 6 shows the switching signal Vsw and the switching frequency signal $V_{SF}$ being supplied by a PWM signal $V_{PWM}$, and details of the ripple cancellation circuitry 10, according to an additional embodiment of the present invention. The PWM signal $V_{PWM}$ controls the switching of energy transfer and storage elements in the switching power supply 12. The frequency of the PWM signal $V_{PWM}$ is the switching frequency. Since the power supply ripple component is created by energy transfer between energy transfer and storage elements, the mathematical relationship between the PWM signal $V_{PWM}$ and the power supply ripple component may be such that the power supply ripple component is proportional to one or more integrations of the PWM signal $V_{PWM}$. Therefore, to create the ripple cancellation signal $V_{RC}$, the PWM signal $V_{PWM}$ must be mathematically integrated. A first integrator 22 and a second integrator 24 are coupled in series between the filtering circuitry 16 and the phase-shifting circuitry 18. Alternate embodiments of the present invention may couple any or all of the filtering circuitry 16, the first integrator 22, the second integrator 24, the phase-shifting circuitry 18, and the amplitude-adjustment circuitry 20 in any order.

Figure 7:
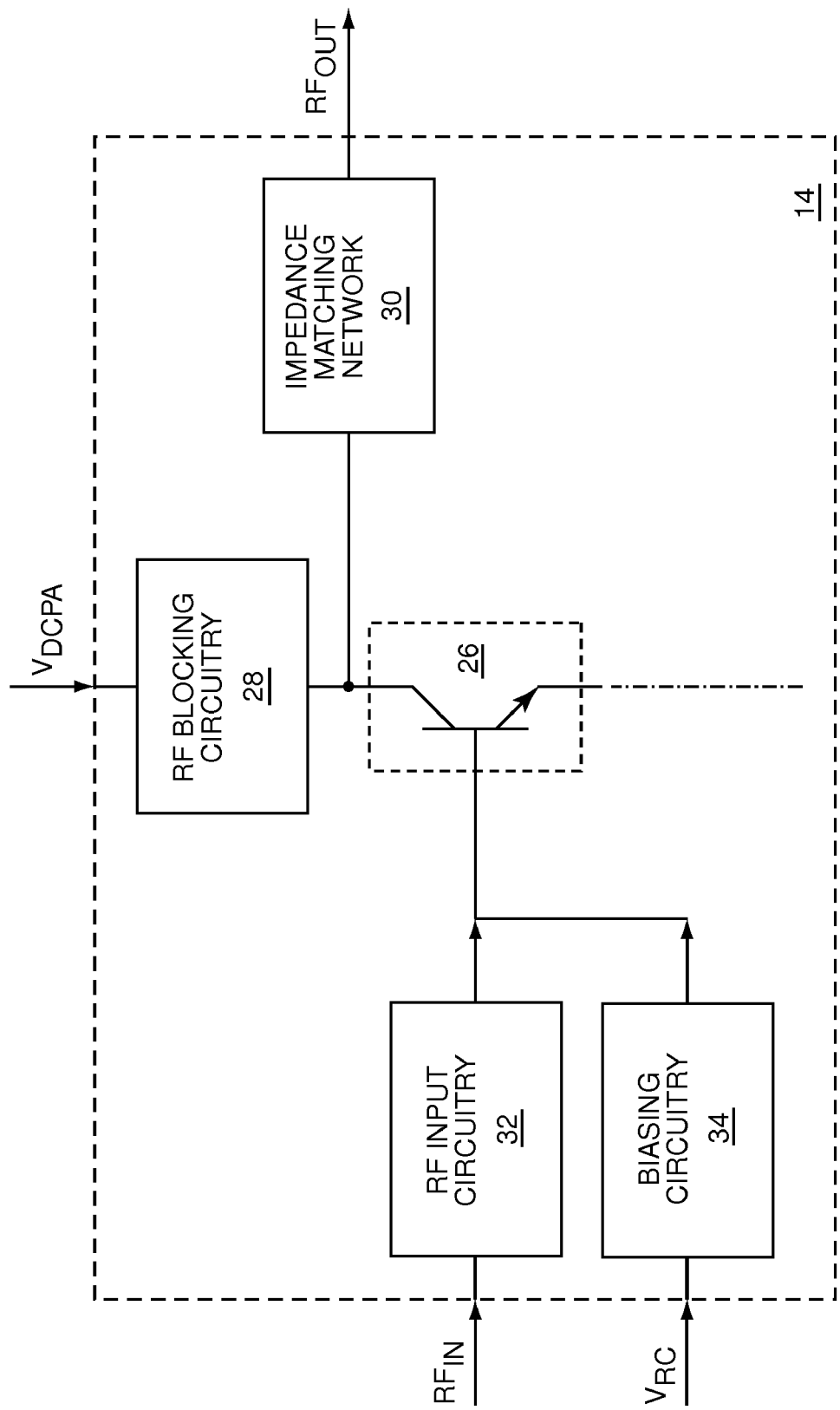
FIG. 7 shows details of the PA final stage illustrated in FIG. 1.

FIG. 7 shows details of the PA final stage 14 illustrated in FIG. 1. A transistor element 26 is shown as a bipolar device, and amplifies the RF input signal $RF_{IN}$ to provide the RF output signal $RF_{OUT}$. RF blocking circuitry 28 is coupled between a collector of the transistor element 26 and the switching power supply 12 to provide the DC PA signal $V_{DCPA}$ to the collector and to block RF signals at the collector from the switching power supply 12. The collector feeds the amplified RF input signal through an impedance matching network 30 to provide the RF output signal $RF_{OUT}$. The impedance matching network 30 may match the impedance of downstream RF circuitry to the output impedance at the collector. The RF input signal $RF_{IN}$ is fed to a base of the transistor element 26 through RF input circuitry 32. Biasing circuitry 34 provides the appropriate bias to the transistor element 26 for proper operation and is coupled to the base of the transistor element 26. In one embodiment of the present invention, the ripple cancellation signal $V_{RC}$ is provided through the bias circuitry 34 and may cancel the output ripple by altering the bias.

Figure 8:
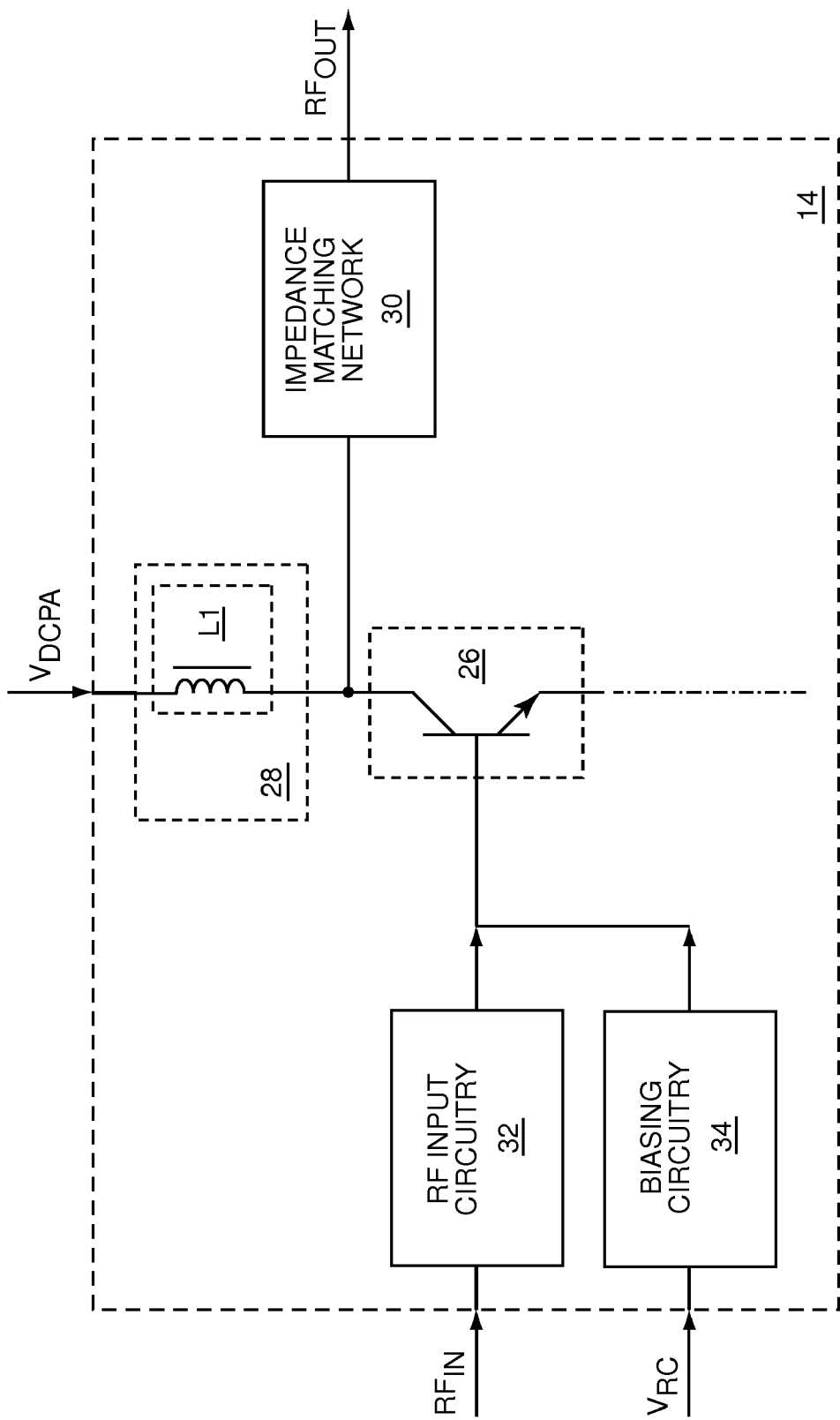
FIG. 8 shows details of the RF blocking circuitry illustrated in FIG. 7.
Figure 9:
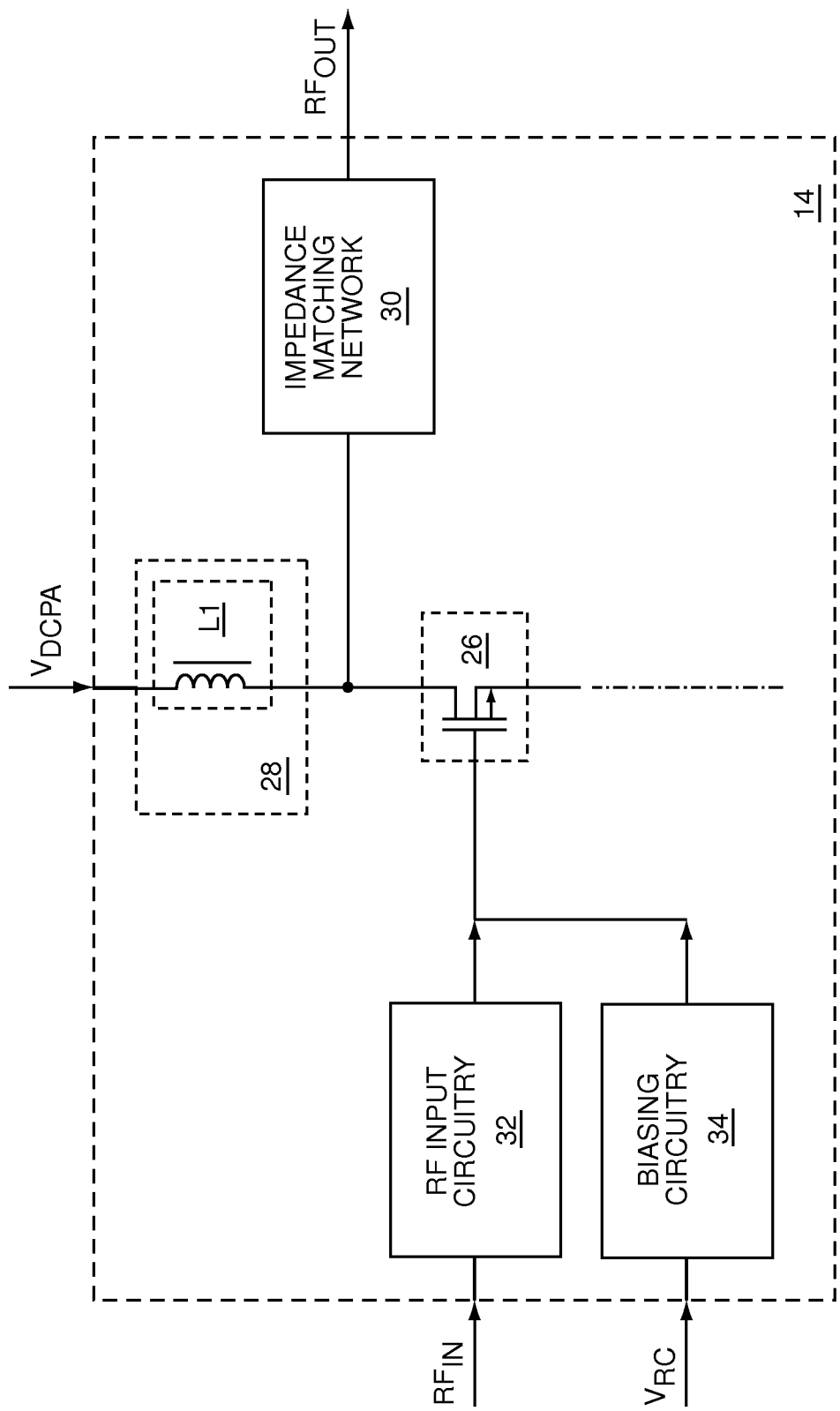
FIG. 9 shows the transistor element of the PA final stage as a MOS device.

FIG. 8 shows details of the RF blocking circuitry 28 illustrated in FIG. 7. The RF blocking circuitry 28 may include a first inductive element L1. FIG. 9 shows the transistor element 26 of the PA final stage 14 as an MOS device instead of a bipolar device. A gate of the MOS device may replace the base of the bipolar device and a drain of the MOS device may replace the collector of the bipolar device.

Figure 10:
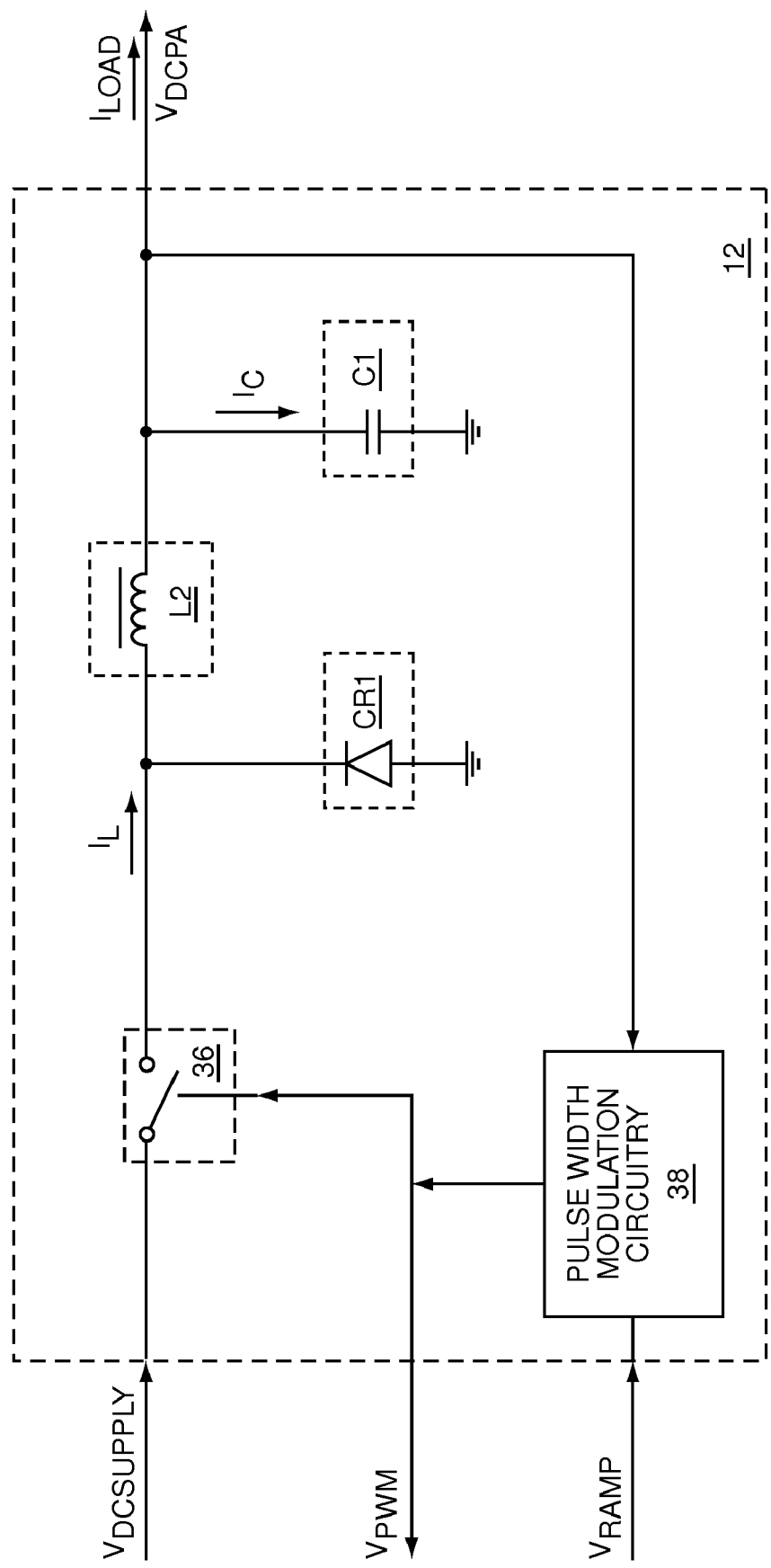
FIG. 10 shows details of the switching power supply illustrated in FIG. 6.

FIG. 10 shows details of the switching power supply 12 illustrated in FIG. 6 arranged in a buck configuration. A buck converter is used when an output voltage from the switching power supply 12 is less than an input voltage to the switching power supply 12. One switched terminal of a switching element 36 is coupled to a second inductive element L2. The other switched terminal of the switching element 36 receives the DC supply signal $V_{DCSUPPLY}$. A cathode of a diode element CR1 is coupled to the switching element 36 and the second inductive element L2. The other end of the second inductive element L2 is coupled to a capacitive element C1 and provides the DC PA signal $V_{DCPA}$. An anode of the diode element CR1 and the capacitive element C1 are coupled to GROUND. Pulse width modulation circuitry 38 provides the PWM signal $V_{PWM}$ to the ripple cancellation circuitry 10 and the switching element 36. The pulse width modulation circuitry 38 receives and regulates the DC PA signal $V_{DCPA}$ by varying the duty-cycle of the PWM signal $V_{PWM}$. A setpoint of the DC PA signal $V_{DCPA}$ is established by the pulse width modulation circuitry 38 based on the DC magnitude control signal $V_{RAMP}$. The second inductive element L2 has an inductor current $I_L$, which supplies a capacitor current $I_C$ to the capacitive element C1 and a load current $I_{LOAD}$ to the PA final stage 14.

The PWM signal $V_{PWM}$ is a square-wave signal having a magnitude of either "1" or "0." When the PWM signal $V_{PWM}$ is a "1," then the switching element 36 is closed, which connects the DC supply signal $V_{DCSUPPLY}$ to the cathode of the diode element CR1 and the second inductive element L2. In this embodiment of the present invention, the switching power supply 12 is a buck converter; therefore, the voltage of the DC PA signal $V_{DCPA}$ is less than the voltage of the DC supply signal $V_{DCSUPPLY}$, which causes the inductor current $I_L$ to increase. When the PWM signal $V_{PWM}$ is a "0," then the switching element 36 is open, which disconnects the DC supply signal $V_{DCSUPPLY}$ from the cathode of the diode element CR1 and the second inductive element L2. The inductor current $I_L$ forward biases the diode element CR1; therefore, the voltage across the second inductive element L2 will be equal to a diode drop plus the voltage of the DC PA signal $V_{DCPA}$ with a polarity that is opposite to the polarity when the switching element 36 is closed, which causes the inductor current $I_L$ to decrease. By varying the duty-cycle of the PWM signal $V_{PWM}$, the portion of a switching cycle in which the inductor current $I_L$ is increasing versus decreasing can be varied, thereby regulating the voltage of the DC PA signal $V_{DCPA}$.

In an alternate embodiment of the present invention, the diode element CR1 may be replaced with a complementary switching element (not shown), which is normally closed when the switching element 36 is open, and vice versa. Such a dual switch arrangement is called a synchronous switching power supply. The complementary switching element may be driven by an inverse of the PWM signal. Additional circuitry may be added to prevent both switches from being closed simultaneously or open simultaneously for very long. Other embodiments of the present invention may use a boost converter, or a combination of a buck converter and a boost converter.

The mathematical relationship of the power supply ripple component of the DC PA signal $V_{DCPA}$ to the PWM signal $V_{PWM}$ is presented below. The voltage of the power supply ripple component of the DC PA signal $V_{DCPA}$ will be shown as $V_{CAC}$. The voltage of the DC component of the DC PA signal $V_{DCPA}$ will be shown as $V_{CDC}$. The voltage at the cathode of the diode element CR1 when the switching element 36 is open will be shown as $V_{CR}$. The voltage across the second inductive element L2 will be shown as $V_L$. The voltage across the capacitive element C1 will be shown as $V_C$. The inductance of the second inductive element L2 will be shown as L. The capacitance of the capacitive element C1 will be shown as C. The voltage of the DC supply signal $V_{DCSUPPLY}$ will be shown as $V_S$. Starting with fundamental equations:

$$I_L = (1/L) \int V_L(dt) + K_1. \quad \text{EQ. 1}$$

$$V_C = (1/C) \int I_C(dt) + K_2. \quad \text{EQ. 2}$$

Since $V_{PWM}$ is either 0 or 1, then:

$$V_L = V_{PWM}(V_S + V_{CR}) - (V_{CDC} + V_{CAC} + V_{CR}). \quad \text{EQ. 3}$$

If $V_{CAC} \ll V_{CDC}$, then:

$$V_L = V_{PWM}(V_S + V_{CR}) - (V_{CDC} + V_{CR}). \quad \text{EQ. 4}$$

Since $V_S$, $V_{CR}$, and $V_{CDC}$ are DC signals, then if $(V_S + V_{CR}) = K_3$, and $(V_{CDC} + V_{CR}) = K_4$, then:

$$V_L \approx V_{PWM}(K_3) - K_4. \quad \text{EQ. 5}$$

Substituting EQ. 5 into EQ. 1:

$$I_L = [(1/L) \int [V_{PWM}(K_3) - K_4](dt)] + K_1. \quad \text{EQ. 6}$$

If $(1/L)(K_3) = K_5$, and if $[(1/L) \int -K_4(dt)] + K_1 = K_6$, then:

$$I_L = K_5 \int [V_{PWM}(dt)] + K_6. \quad \text{EQ. 7}$$

From FIG. 10:

$$I_L = I_C + I_{LOAD} \text{ or } I_C = I_L - I_{LOAD}. \quad \text{EQ. 8}$$

Substituting EQ. 8 into EQ. 2:

$$V_C = (1/C) \int [(I_L - I_{LOAD})(dt)] + K_2. \quad \text{EQ. 9}$$

If $(1/C) = K_7$, and if $[(1/C) \int -I_{LOAD}(dt)] + K_2 = K_8$, then:

$$V_C = K_7 \int [I_L(dt)] + K_8. \quad \text{EQ. 10}$$

Substituting EQ. 7 into EQ. 10:

$$V_C \approx K_7 \int [[K_5 \int [V_{PWM}(dt)] + K_6](dt)] + K_8. \quad \text{EQ. 11}$$

If $(K_7)(K_5) = K_9$, and if $[(K_7) \int K_6(dt)] + K_8 = K_{10}$, then:

$$V_C \approx K_9 \int \int [V_{PWM}(dt)] + K_{10}. \quad \text{EQ. 12}$$

From EQ. 12, since $V_C = V_{CDC} + V_{CAC}$, then the voltage of the power supply ripple component $V_{CAC}$ is proportional to the double integral of the PWM signal $V_{PWM}$.

Figure 11:
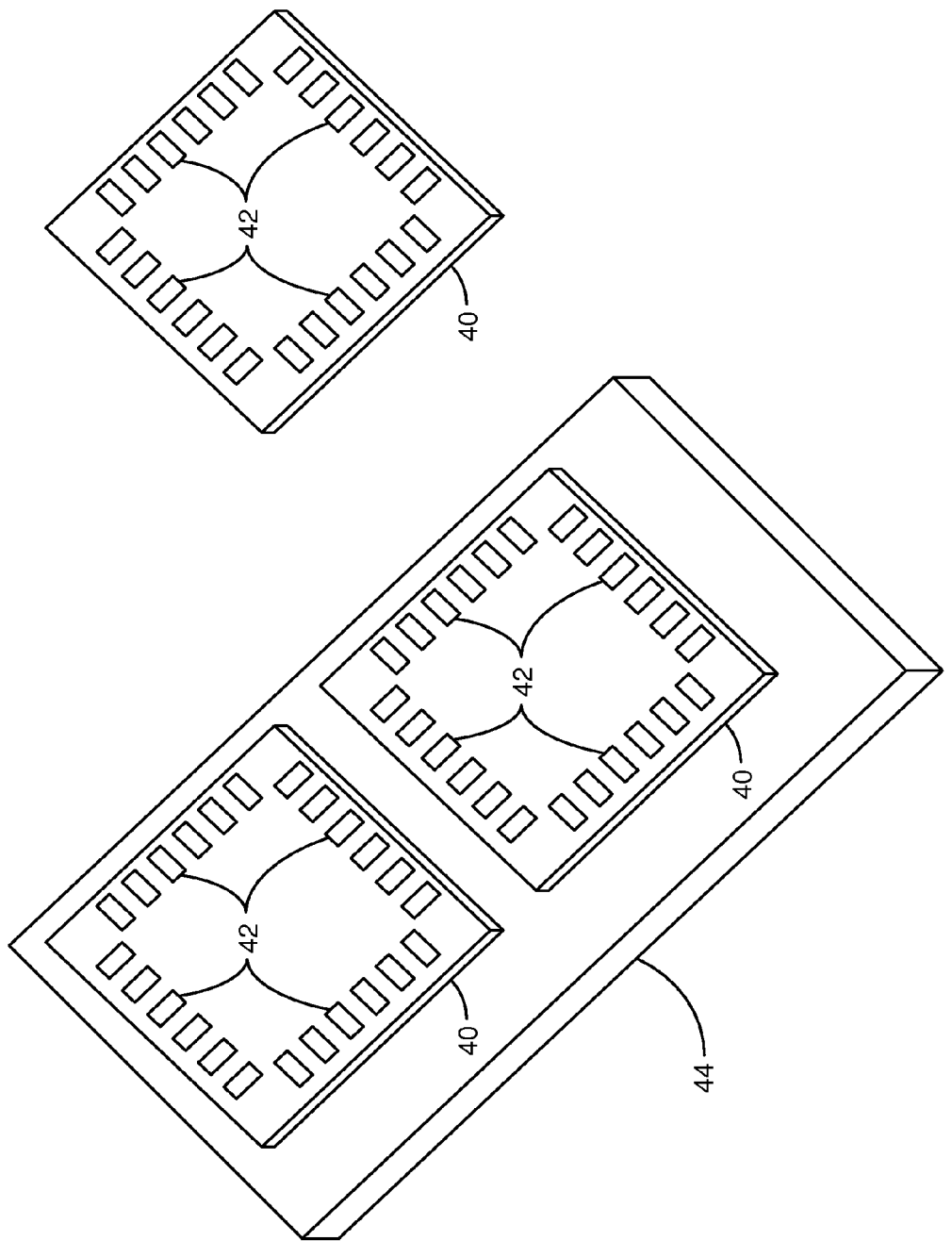
FIG. 11 shows the present invention provided by a semiconductor die or multiple dies on a common substrate.

FIG. 11 shows the present invention provided by a semiconductor die 40, which includes inter-connection pads 42. In one embodiment of the present invention, the ripple cancellation circuitry 10, the switching power supply 12, the PA final stage 14, or any combination thereof, are provided by the semiconductor die 40. In an alternate embodiment of the present invention, multiple semiconductor dies 40 may be mounted to a substrate 44. The ripple cancellation circuitry 10, the switching power supply 12, the PA final stage 14, or any combination thereof, may be provided by any combination of the semiconductor dies 40.

Figure 12:
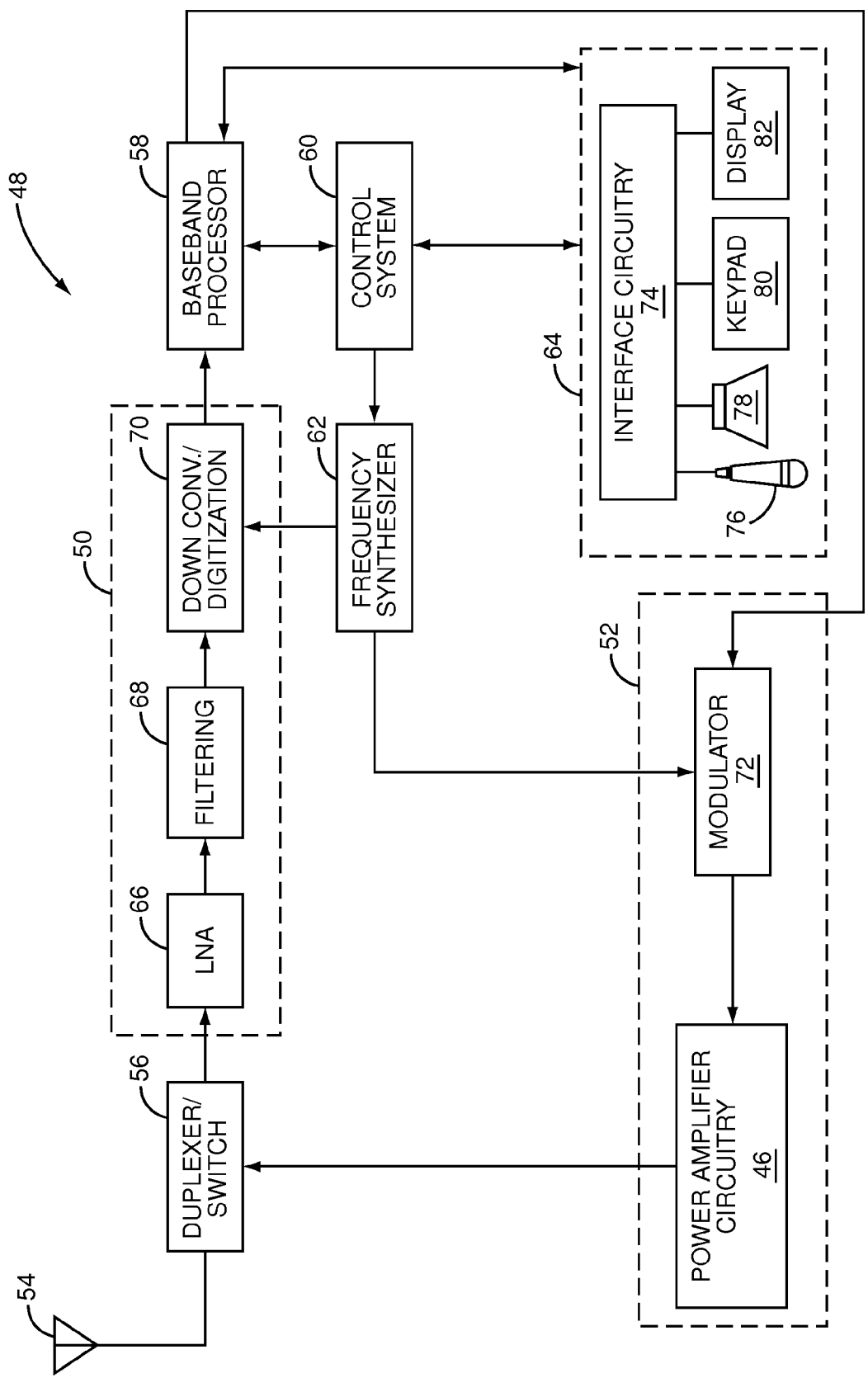
FIG. 12 shows an application example of the present invention used in a mobile terminal.

An application example of an RF power amplifier is its use in power amplifier circuitry 46 in a mobile terminal 48, the basic architecture of which is represented in FIG. 12. The mobile terminal 48 may include a receiver front end 50, a radio frequency transmitter section 52, an antenna 54, a duplexer or switch 56, a baseband processor 58, a control system 60, a frequency synthesizer 62, and an interface 64. The receiver front end 50 receives information bearing radio frequency signals from one or more remote transmitters provided by a base station. A low noise amplifier (LNA) 66 amplifies the signal. A filter circuit 68 minimizes broadband interference in the received signal, while down conversion and digitization circuitry 70 down converts the filtered, received signal to an intermediate or baseband frequency signal, which is then digitized into one or more digital streams. The receiver front end 50 typically uses one or more mixing frequencies generated by the frequency synthesizer 62. The baseband processor 58 processes the digitized received signal to extract the information or data bits conveyed in the received signal. This processing typically comprises demodulation, decoding, and error correction operations. As such, the baseband processor 58 is generally implemented in one or more digital signal processors (DSPs).

On the transmit side, the baseband processor 58 receives digitized data, which may represent voice, data, or control information, from the control system 60, which it encodes for transmission. The encoded data is output to the transmitter 52, where it is used by a modulator 72 to modulate a carrier signal that is at a desired transmit frequency. The power amplifier circuitry 46 amplifies the modulated carrier signal to a level appropriate for transmission, and delivers the amplified and modulated carrier signal to the antenna 54 through the duplexer or switch 56.

A user may interact with the mobile terminal 48 via the interface 64, which may include interface circuitry 74 associated with a microphone 76, a speaker 78, a keypad 80, and a display 82. The interface circuitry 74 typically includes analog-to-digital converters, digital-to-analog converters, amplifiers, and the like. Additionally, it may include a voice encoder/decoder, in which case it may communicate directly with the baseband processor 58. The microphone 76 will typically convert audio input, such as the user's voice, into an electrical signal, which is then digitized and passed directly or indirectly to the baseband processor 58. Audio information encoded in the received signal is recovered by the baseband processor 58, and converted by the interface circuitry 74 into an analog signal suitable for driving the speaker 78. The keypad 80 and display 82 enable the user to interact with the mobile terminal 48, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. Radio frequency (RF) power amplifier (PA) circuitry comprising:
    a switching direct current (DC) power supply adapted to:
        provide a DC power supply signal having a power supply ripple component based on a switching frequency; and
        provide a switching signal based on the switching frequency;
    ripple cancellation circuitry adapted to receive the switching signal and provide a ripple cancellation signal based on the switching frequency; and
    a PA final stage adapted to:
        receive the DC power supply signal to provide power for amplification;
        receive an RF input signal;
        receive the ripple cancellation signal; and
        amplify the RF input signal in light of the ripple cancellation signal to provide an RF output signal having an output ripple based on a combination of effects of the power supply ripple component and effects of the ripple cancellation signal.

2. The RF PA circuitry of claim 1 wherein the output ripple is substantially canceled by the combination.

3. The RF PA circuitry of claim 1 wherein the switching signal is further based on the DC power supply signal.

4. The RF PA circuitry of claim 1 wherein the switching signal is further based on the power supply ripple component.

5. The RF PA circuitry of claim 1 wherein the ripple cancellation circuitry comprises filtering circuitry such that the ripple cancellation signal is further based on a filtered switching signal.

6. The RF PA circuitry of claim 1 wherein the ripple cancellation circuitry comprises phase-shifting circuitry such that the ripple cancellation signal is phase-shifted from the switching signal to substantially minimize the output ripple.

7. The RF PA circuitry of claim 6 wherein the switching DC power supply is adapted to provide and the phase-shifting circuitry is adapted to receive a switching frequency signal based on the switching frequency such that the phase-shifting is based on the switching frequency signal.

8. The RF PA circuitry of claim 7 wherein the switching signal provides the switching frequency signal.

9. The RF PA circuitry of claim 1 wherein the ripple cancellation circuitry comprises amplitude-adjustment circuitry such that the ripple cancellation signal is amplitude-adjusted from the switching signal to substantially minimize the output ripple.

10. The RF PA circuitry of claim 9 wherein the switching DC power supply and the amplitude-adjustment circuitry are adapted to receive a DC magnitude control signal such that a magnitude of the DC power supply signal and the amplitude-adjusting are based on the DC magnitude control signal.

11. The RF PA circuitry of claim 1 wherein the switching DC power supply is adapted to provide a pulse width modulated (PWM) switching signal such that the switching signal is further based on the PWM switching signal.

12. The RF PA circuitry of claim 11 wherein the ripple cancellation circuitry comprises a first integrator such that the ripple cancellation signal is further based on an integrated switching signal.

13. The RF PA circuitry of claim 12 wherein the ripple cancellation circuitry further comprises a second integrator such that the ripple cancellation signal is further based on a double-integrated switching signal.

14. The RF PA circuitry of claim 1 wherein the PA final stage comprises:
    an RF blocking network adapted to receive the DC power supply signal and provide the power for amplification to a transistor element such that RF signals from the transistor element are substantially blocked from the switching DC power supply; and
    the transistor element comprising:
        a transistor input adapted to receive the RF input signal; and
        a transistor output adapted to receive the power for amplification from the RF blocking network and provide the RF output signal.

15. The RF PA circuitry of claim 14 wherein the transistor input is further adapted to receive the ripple cancellation signal.

16. The RF PA circuitry of claim 14 wherein the PA final stage further comprises biasing circuitry coupled to the transistor input and adapted to:
    provide a bias to the transistor element; and
    receive the ripple cancellation signal.

17. The RF PA circuitry of claim 16 wherein the bias is based on the ripple cancellation signal.

18. The RF PA circuitry of claim 14 wherein the transistor element further comprises a bipolar transistor element such that the transistor input comprises a base of the bipolar transistor element and the transistor output comprises a collector of the bipolar transistor element.

19. The RF PA circuitry of claim 14 wherein the transistor element further comprises a metal oxide semiconductor (MOS) transistor element such that the transistor input comprises a gate of the MOS transistor element and the transistor output comprises a drain of the MOS transistor element.

20. The RF circuitry of claim 1 wherein at least one of the switching DC power supply, the ripple cancellation circuitry, and the PA final stage is provided by a single semiconductor die.

21. The RF circuitry of claim 1 wherein at least one of the switching DC power supply, the ripple cancellation circuitry, and the PA final stage are provided by at least two semiconductor dies mounted to a common substrate.

22. A method comprising:
    providing a direct current (DC) power supply signal having a power supply ripple component based on a switching frequency;
    providing a switching signal based on the switching frequency;
    receiving the switching signal and providing a ripple cancellation signal based on the switching frequency;
    receiving the DC power supply signal to provide power for amplification;
    receiving an RF input signal and the ripple cancellation signal; and
    amplifying the RF input signal in light of the ripple cancellation signal to provide an RF output signal having an output ripple based on a combination of effects of the power supply ripple component and effects of the ripple cancellation signal.

* * * * *

UNITED STATES PATENT AND TRADEMARK OFFICE
CERTIFICATE OF CORRECTION

PATENT NO.        : 7,471,155 B1                                    Page 1 of 1
APPLICATION NO. : 11/753888
DATED             : December 30, 2008
INVENTOR(S)       : Chris Levesque It is certified that error appears in the above-identified patent and that said Letters Patent is hereby corrected as shown below:

In column 7, at line 39, EQ. 4, replace = with ≈

In column 7, at line 47, EQ. 6, replace = with ≈

In column 7, at line 50, EQ. 7, replace = with ≈

Signed and Sealed this

Seventeenth Day of March, 2009

JOHN DOLL
*Acting Director of the United States Patent and Trademark Office*